US011825633B2

(12) United States Patent
Trotman et al.

(10) Patent No.: US 11,825,633 B2
(45) Date of Patent: Nov. 21, 2023

(54) CIRCUIT CARD ASSEMBLY (CCA) MODULE THERMAL INTERFACE DEVICES

(71) Applicant: Hamilton Sundstrand Corporation (HSC), Charlotte, NC (US)

(72) Inventors: Alexander Trotman, South Windsor, CT (US); Josh Kamp, Glastonbury, CT (US); Judy Schwartz, Longmeadow, MA (US); Robert DeFelice, South Windsor, CT (US); Michael Doe, Jr., Southwick, MA (US); Anthony Matthew DeLugan, Westfield, MA (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 17/674,035

(22) Filed: Feb. 17, 2022

(65) Prior Publication Data

US 2023/0262941 A1     Aug. 17, 2023

(51) Int. Cl.
    *H05K 7/20*     (2006.01)
    *H05K 7/14*     (2006.01)

(52) U.S. Cl.
    CPC .......... *H05K 7/205* (2013.01); *H05K 7/1404* (2013.01); *H05K 7/20545* (2013.01)

(58) Field of Classification Search
    CPC ... H05K 7/205; H05K 7/1404; H05K 7/20545
    USPC ....................................................... 361/704
    See application file for complete search history.

(56) References Cited

U.S. PATENT DOCUMENTS

| 6,483,702 | B1 | 11/2002 | Lofland |
| 8,385,073 | B2 | 2/2013 | Tam et al. |
| 8,659,902 | B2 | 2/2014 | Colongo et al. |
| 10,354,979 | B1 | 7/2019 | Faoro |
| 10,667,431 | B1 | 5/2020 | Unsman et al. |
| 10,691,184 | B1 | 6/2020 | Ganta Papa Rao Bala et al. |
| 2004/0085728 | A1 | 5/2004 | Barth et al. |
| 2010/0309626 | A1* | 12/2010 | Xu ............................ G06F 1/20 |
| | | | 361/679.54 |

(Continued)

FOREIGN PATENT DOCUMENTS

| KR | 20120085489 A | * | 8/2012 | ........... H05K 7/1418 |
| TW | M315009 U | * | 7/2007 | ................ H05K 7/20 |

OTHER PUBLICATIONS

Partial European Search Report dated Jun. 23, 2023, issued during the prosecution of European Patent Application No. EP 23156793.4.

*Primary Examiner* — Anatoly Vortman
*Assistant Examiner* — Zhengfu J Feng
(74) *Attorney, Agent, or Firm* — Locke Lord LLP; Joshua L. Jones; Scott D. Wofsy

(57) ABSTRACT

An assembly includes a circuit card assembly (CCA) module including a CCA with heat generating electronic components and a connector electrically connected to the heat generating electronic components. A chassis including an electrical interface is included. The connector of the CCA module is electrically connected to the electrical interface. The chassis includes a removable cover. A heat transfer element is included between the cover of the chassis and an edge of the CCA module for heat sinking heat from the heat generating electronic components through the heat transfer element to the cover of the chassis.

6 Claims, 3 Drawing Sheets

(56) References Cited

U.S. PATENT DOCUMENTS

| | | | |
|---|---|---|---|
| 2010/0320187 A1 | 12/2010 | Griffin et al. | |
| 2010/0321891 A1* | 12/2010 | Steenwyk | H05K 7/20545 |
| | | | 361/707 |
| 2012/0020017 A1 | 1/2012 | Kehret et al. | |
| 2012/0063084 A1* | 3/2012 | Fowler | H05K 7/1418 |
| | | | 361/699 |
| 2014/0321061 A1* | 10/2014 | Moore | B32B 27/281 |
| | | | 361/709 |
| 2020/0174534 A1* | 6/2020 | Ganta Papa Rao Bala | |
| | | | G06F 1/181 |

* cited by examiner

CIRCUIT CARD ASSEMBLY (CCA) MODULE THERMAL INTERFACE DEVICES

BACKGROUND

1. Field

The present disclosure relates to heat transfer in electronic devices, and more particularly to heat transfer interfaces for circuit card assemblies (CCAs).

2. Description of Related Art

As the electronics industry pushes towards more and more modularity, replaceable card-guide circuit card assembly (CCA) designs are becoming increasingly common. With this modularity comes the need for modules to be quickly installed and removed. This modularity requirement typically reduces the number of opportunities for permanent thermal interface features. This provides significant challenges for thermal management as the power dissipation of these CCAs grows with the demands of future designs and applications.

The conventional techniques have been considered satisfactory for their intended purpose. However, there is an ever present need for improved systems and methods for thermal interfacing for CCAs and the like. This disclosure provides a solution for this need.

SUMMARY

An assembly includes a circuit card assembly (CCA) module including a CCA with heat generating electronic components and a connector electrically connected to the heat generating electronic components. A chassis including an electrical interface is included. The connector of the CCA module is electrically connected to the electrical interface. The chassis includes a removable cover. A heat transfer element is included between the cover of the chassis and an edge of the CCA module for heat sinking heat from the heat generating electronic components through the heat transfer element to the cover of the chassis.

The removable cover can be on an opposite side of the chassis from the electrical interface. The edge of the CCA module can be opposite the connector. The heat transfer element can be metallic. The heat transfer element can be resiliently compressed between the CCA module and the cover. The heat transfer element can include undulations in a direction away from the connector. The undulations in an uncompressed state can be larger than a gap between the CCA module and the cover so as to compress between the CCA module and the cover.

The heat transfer element can be affixed to the CCA module for removal and installation from the chassis together with the CCA module. The heat transfer element can be affixed to the cover for removal and installation from the chassis together with the cover. The heat transfer element can be in thermal contact with an interior surface of the cover. An exterior surface of the cover can include heat transfer fins.

These and other features of the systems and methods of the subject disclosure will become more readily apparent to those skilled in the art from the following detailed description of the preferred embodiments taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, preferred embodiments thereof will be described in detail herein below with reference to certain figures, wherein.

DETAILED DESCRIPTION OF THE PREFERRED EMBODIMENTS

Figure 1:
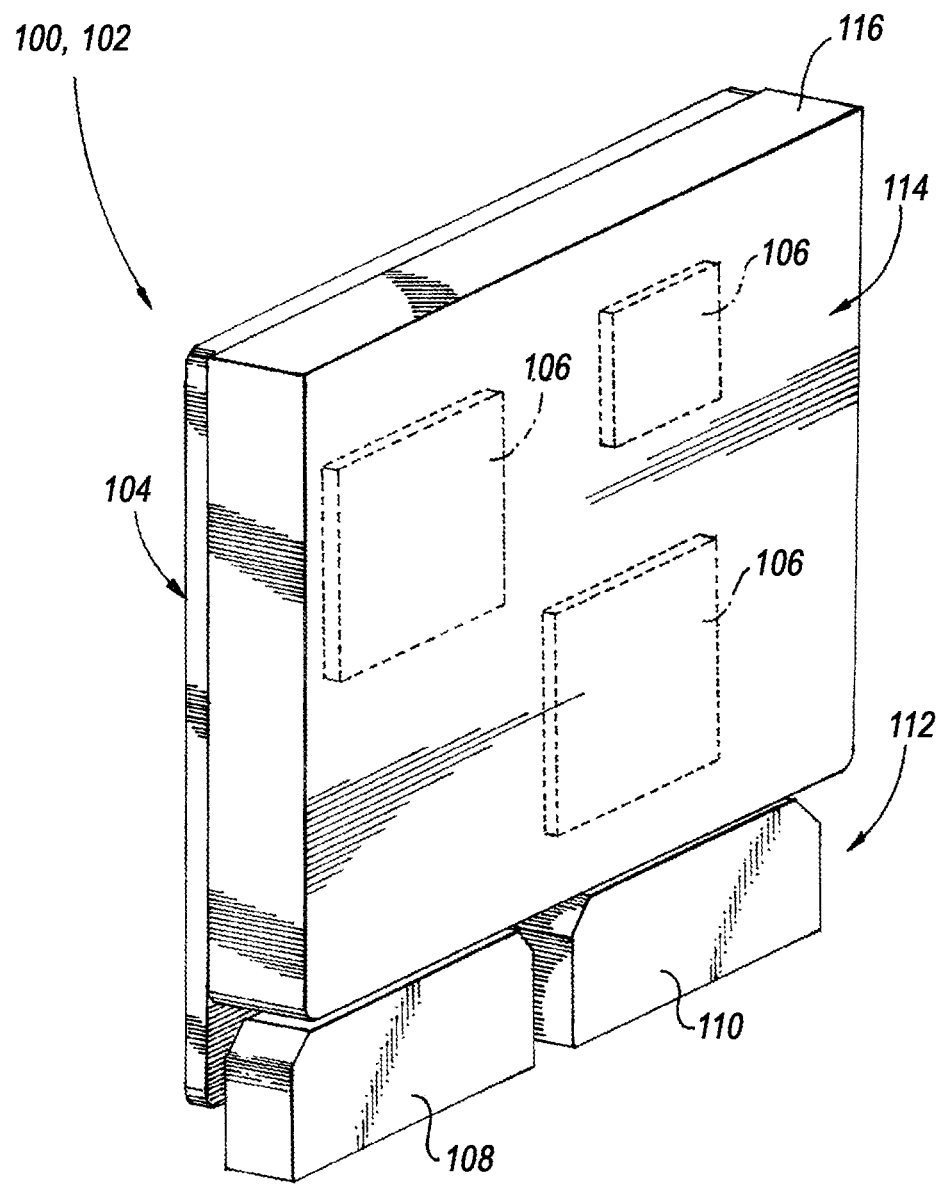
FIG. 1 is a schematic perspective view of an embodiment of a circuit card assembly (CCA) module constructed in accordance with the present disclosure, showing the heat generating electronic components.

Reference will now be made to the drawings wherein like reference numerals identify similar structural features or aspects of the subject disclosure. For purposes of explanation and illustration, and not limitation, a partial view of an embodiment of an assembly in accordance with the disclosure is shown in FIG. 1 and is designated generally by reference character 100. Other embodiments of systems in accordance with the disclosure, or aspects thereof, are provided in FIGS. 2-3, as will be described. The systems and methods described herein can be used to enhance heat transfer from heat generating components in circuit card assemblies (CCAs).

The assembly 100 includes a circuit card assembly (CCA) module 102 including a CCA 104 with heat generating electronic components 106 and one or more connectors 108, 110 electrically connected to the heat generating electronic components 106. The connectors 108, 110 are on a connector end 112 of the module 102. A heatsink 114 is assembled onto the module 102, and forms a heatsink edge 116 of the module 102 opposite the connector end 112.

Figure 2:
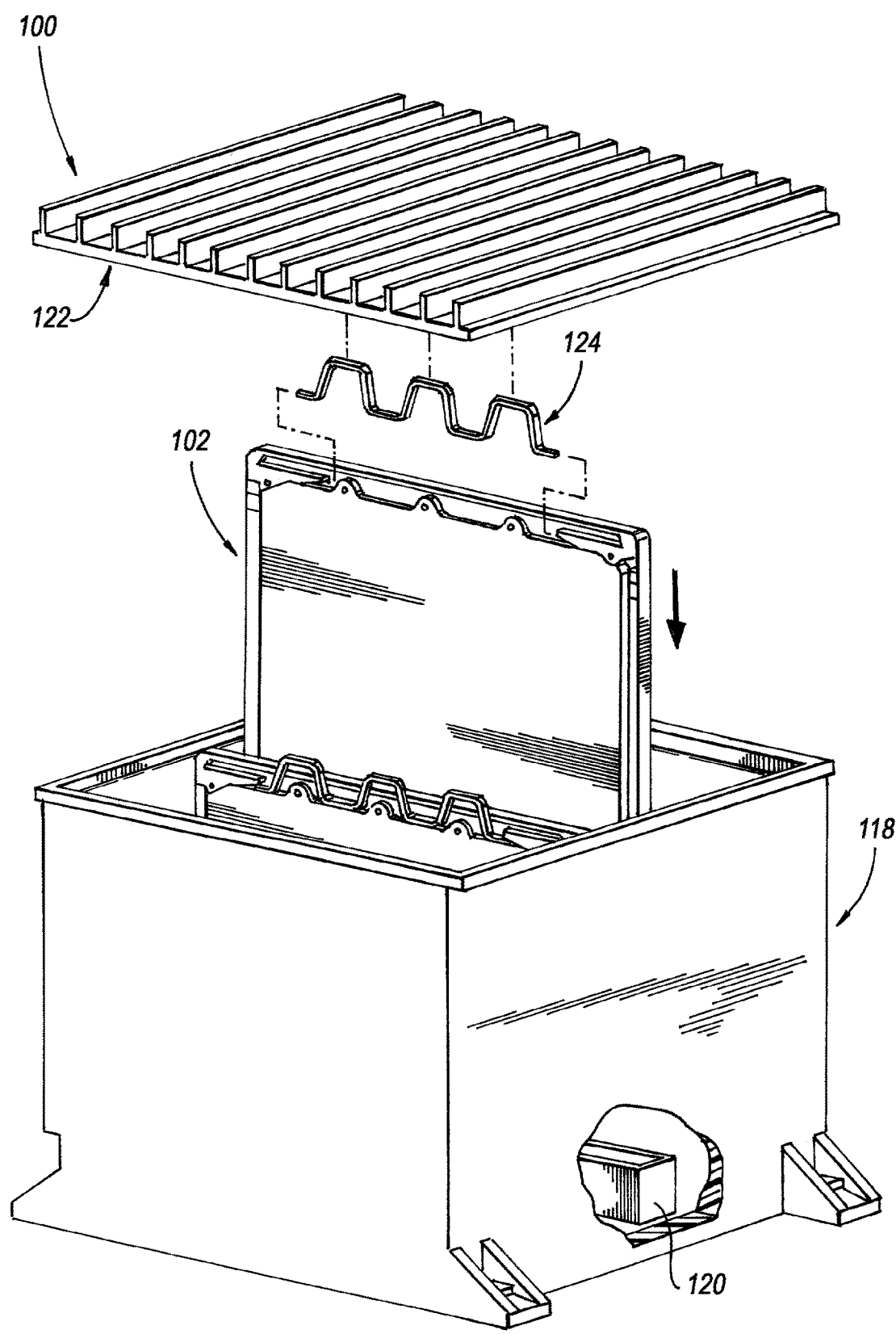
FIG. 2 is an exploded perspective view of the CCA module of FIG. 1 being assembled into a chassis.

With reference now to FIG. 2, a chassis 118 including an electrical interface 120 is included in the end assembly 100. The connector(s) 108, 110 of the CCA module 102 is/are electrically connected to the electrical interface 120 when the module 102 is fully inserted into the chassis 118 as indicated by the large arrow in FIG. 2. The chassis 118 includes a removable cover 122, which can be used to enclose one or more module(s) 102 inside of the chassis 118, and can be removed to access the module(s) 102 for removal, replacement, repair, or the like. The removable cover 122 is mounted on an opposite side of the chassis 118 from the electrical interface 120 to enclose the interior of the chassis 118.

Figure 3:
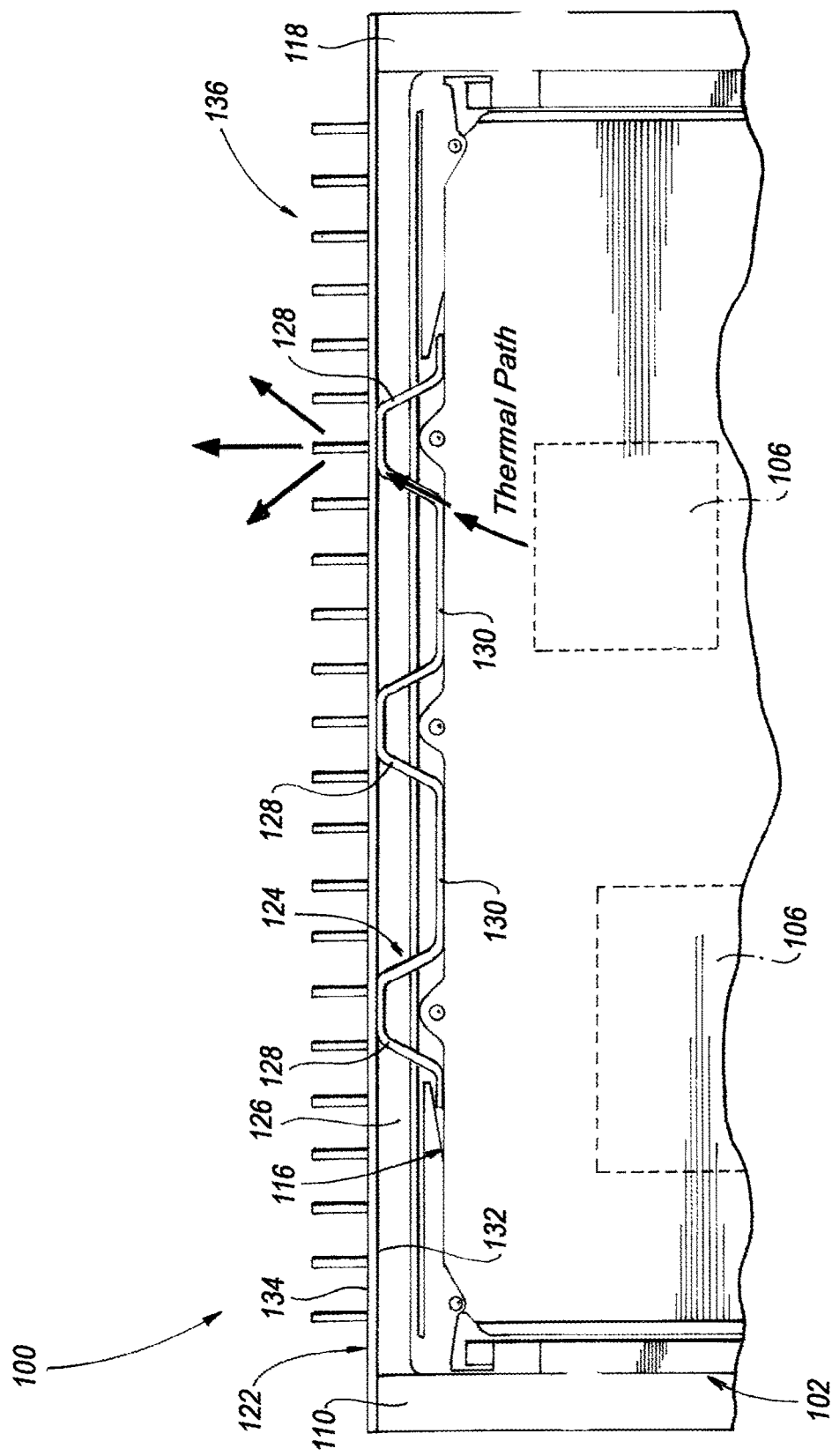
FIG. 3 is a cross-sectional side elevation view of the assembly of FIG. 2, showing the heat transfer element in the gap between the CCA module and the removable cover of the chassis.

With reference now to FIG. 3, a heat transfer element 124 is included in the gap 126 between the cover 124 of the chassis 118 and the heatsink edge 116 of the CCA module 102 for heat sinking heat from the heat generating electronic components 106 through the heat transfer element 124 to the cover 122 of the chassis 118 as indicated by the heat flow arrows in FIG. 3.

The heat transfer element 124 is metallic and flexible or resilient, although any suitable material can be used with appropriate properties of heat conduction and mechanical flexibility. The heat transfer element 124 is resiliently compressed between the CCA module 102 and the cover 122. The heat transfer element 124 includes undulations 128 that extend in a direction away from the connectors 108, 110 (which are labeled in FIG. 1), or in other words, that extend upward as oriented in FIG. 3. The undulations 128 in an uncompressed state are larger than the gap 126 between the CCA module 102 and the cover 122 so as to compress between the CCA module 102 and the cover 122 for intimate thermal contact with both the CCA module 102 and the cover 122.

The heat transfer element 124 can be affixed to the CCA module 102 for removal and installation from the chassis together with the CCA module, e.g. with adhesive or fasteners at points 130. It is also contemplated that the heat transfer element 124 can instead be affixed to the cover 122, e.g. with adhesive or fasteners at the tops of the undulations 128 as oriented in FIG. 3, for removal and installation from the chassis 118 together with the cover 122. This latter configuration could be used for CCA modules that do not already include their own heat transfer element 124. The heat transfer element 124, in particular at the tops of the undulations 128 as oriented in FIG. 3, is in thermal contact with an interior surface 132 of the cover 122. The exterior surface 134 of the cover 122 can optionally include heat transfer fins 136 to aid in heatsinking heat from the CCA module 102, and to provide stiffness to the cover 122. The heat transfer element 124 is flexible enough to accommodate the tolerance stack-up between the CCA module 102 and the cover 122, while still providing sufficient contact pressure for heat transfer.

Systems and methods as disclosed herein can provide potential benefits such as the following. In terms of technical performance, the systems and methods disclosed herein provide a new thermal interface between top of CCA module(s) and chassis covers. Systems and methods as disclosed herein distribute thermal load of CCA module(s) more evenly across the entire end assembly. One heat transfer element as disclosed herein can be applied across multiple adjacent modules in a single end assembly, or multiple modules in a chassis can each have their own dedicated heat transfer elements. Due to the enhanced heat sinking capability, the heat transfer element can provide for reduced cost, weight, and complexity in end assemblies.

The heat transfer element can be made fully removable depending on modular end assembly requirements for a given application, and can reduce overall weight in scenarios where less module heatsink is required as a result of utilizing the heat transfer element 124.

The methods and systems of the present disclosure, as described above and shown in the drawings, provide for improved heat transfer from heat generating components in CCAs relative to traditional measures. While the apparatus and methods of the subject disclosure have been shown and described with reference to preferred embodiments, those skilled in the art will readily appreciate that changes and/or modifications may be made thereto without departing from the scope of the subject disclosure.

What is claimed is:

1. An assembly comprising:
   a circuit card assembly (CCA) module including a CCA with heat generating electronic components and a connector electrically connected to the heat generating electronic components;
   a chassis including an electrical interface, wherein the connector of the CCA module is electrically connected to the electrical interface, wherein the chassis includes a removable cover; and
   a heat transfer element between the removable cover of the chassis and an edge of the CCA module for heat sinking heat from the heat generating electronic components through the heat transfer element to the removable cover of the chassis, wherein the heat transfer element is metallic, wherein the heat transfer element is resiliently compressed between the CCA module and the removable cover, wherein the heat transfer element includes undulations in a direction away from the connector, and wherein the undulations in an uncompressed state are larger than a gap between the CCA module and the removable cover so as to compress between the CCA module and the removable cover.

2. The assembly as recited in claim 1, wherein the removable cover is on an opposite side of the chassis from the electrical interface.

3. The assembly as recited in claim 1, wherein the edge of the CCA module is opposite the connector.

4. The assembly as recited in claim 1, wherein the heat transfer element is affixed to the CCA module for removal and installation from the chassis together with the CCA module.

5. The assembly as recited in claim 1, wherein the heat transfer element is affixed to the removable cover for removal and installation from the chassis together with the removable cover.

6. The assembly as recited in claim 1, wherein the heat transfer element is in thermal contact with an interior surface of the removable cover, and wherein an exterior surface of the removable cover includes heat transfer fins.

* * * * *